United States Patent
Tamura et al.

(10) Patent No.: US 10,793,756 B2
(45) Date of Patent: Oct. 6, 2020

(54) ADHESIVE COMPOSITION, ADHESIVE FILM, AND BONDING METHOD

(71) Applicant: Tokyo Ohka Kogyo Co., Ltd., Kawasaki-shi (JP)

(72) Inventors: Koki Tamura, Kawasaki (JP); Hirofumi Imai, Kawasaki (JP); Toshiyuki Ogata, Kawasaki (JP); Atsushi Kubo, Kawasaki (JP); Takahiro Yoshioka, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 16/141,696

(22) Filed: Sep. 25, 2018

(65) Prior Publication Data

US 2019/0023953 A1  Jan. 24, 2019

Related U.S. Application Data

(63) Continuation of application No. 14/391,569, filed as application No. PCT/JP2013/057208 on Mar. 14, 2013, now abandoned.

(30) Foreign Application Priority Data

Apr. 13, 2012  (JP) .................................. 2012-092204
Mar. 8, 2013  (JP) .................................. 2013-047374

(51) Int. Cl.
| | | |
|---|---|---|
| C09J 153/00 | (2006.01) | |
| C09J 7/38 | (2018.01) | |
| C09J 7/20 | (2018.01) | |
| C09J 5/00 | (2006.01) | |
| C09J 153/02 | (2006.01) | |
| H01L 21/683 | (2006.01) | |

(52) U.S. Cl.
CPC .............. *C09J 153/00* (2013.01); *C09J 5/00* (2013.01); *C09J 7/20* (2018.01); *C09J 7/387* (2018.01); *C09J 153/025* (2013.01); *H01L 21/6835* (2013.01); *C09J 2203/326* (2013.01); *C09J 2453/00* (2013.01); *H01L 2221/6834* (2013.01); *H01L 2221/68318* (2013.01); *H01L 2221/68327* (2013.01); *H01L 2221/68381* (2013.01); *Y10T 428/2883* (2015.01)

(58) Field of Classification Search
CPC ..... C09J 153/00; C09J 7/38; C09J 7/20; C09J 5/00; C09J 153/02; H01L 21/683
USPC ............................................. 524/88; 156/334
See application file for complete search history.

(56) References Cited

U.S. PATENT DOCUMENTS

| | | | |
|---|---|---|---|
| 5,118,762 A | 6/1992 | Chin | |
| 5,538,771 A | 7/1996 | Nakayama et al. | |
| 5,851,664 A | 12/1998 | Bennett et al. | |
| 6,793,762 B1 | 9/2004 | Kondo et al. | |
| 2005/0054779 A1* | 3/2005 | Zhou ........................ | B32B 7/12 525/240 |
| 2010/0227996 A1 | 9/2010 | Asai et al. | |
| 2012/0083561 A1 | 4/2012 | Imai et al. | |
| 2013/0081760 A1* | 4/2013 | Imai ....................... | C09J 153/02 156/334 |

FOREIGN PATENT DOCUMENTS

| | | |
|---|---|---|
| DE | 2609362 | 9/1977 |
| JP | H11-343469 A | 12/1999 |
| JP | 2005-191296 A | 7/2005 |
| JP | 2006-188646 A | 7/2006 |
| JP | 2011-162747 * | 8/2011 |
| JP | 2011-162747 A | 8/2011 |
| JP | 2012-036269 A | 2/2012 |
| TW | 215453 B | 11/1993 |
| TW | 311927 B | 8/1997 |
| WO | WO 2008/029569 A1 | 3/2008 |

OTHER PUBLICATIONS

International Search Report issued in International Patent Application No. PCT/JP2013/057208 dated May 14, 2013.
Office Action received in Taiwan Patent Application No. 102112692 dated Apr. 13, 2016.
Non-Final Office Action received in U.S. Appl. No. 14/391,569 dated Sep. 11, 2015.

(Continued)

*Primary Examiner* — Deve V Hall
(74) *Attorney, Agent, or Firm* — Knobbe, Martens, Olson & Bear LLP

(57) ABSTRACT

An adhesive composition contains (a) a resin consisting of (i) a block copolymer or (ii) 35% by weight or greater and less than 100% of the block copolymer and 65% by weight or less of a random copolymer, the block copolymer having a weight average molecular weight in a range of 50,000 to 150,000, wherein the block copolymer is a diblock copolymer, a triblock copolymer, or a combination thereof, and includes a styrene group, both terminals of a main chain of the triblock copolymer are styrene groups; (b) a solvent which includes a condensed polycyclic hydrocarbon, wherein an adhesive layer formed by using the adhesive composition has a Young's modulus of 0.1 GPa or greater at 23° C., a storage modulus (G') of $1.5 \times 10^5$ Pa or less at 220° C., and a loss factor (tan σ) of 1.3 or less at 220° C.; and (c) a thermal polymerization inhibitor.

9 Claims, No Drawings

(56) References Cited

OTHER PUBLICATIONS

Final Office Action received in U.S. Appl. No. 14/391,569 dated Jan. 11, 2016.
Non-Final Office Action received in U.S. Appl. No. 14/391,569 dated Jun. 17, 2016.
Non-Final Office Action received in U.S. Appl. No. 14/391,569 dated Sep. 14, 2016.
Final Office Action received in U.S. Appl. No. 14/391,569 dated Jan. 11, 2017.

* cited by examiner

ADHESIVE COMPOSITION, ADHESIVE FILM, AND BONDING METHOD

TECHNICAL FIELD

The present invention relates to an adhesive composition, an adhesive film, and a bonding method.

BACKGROUND ART

As an adhesive composition forming an adhesive layer for bonding a sheet or the like onto a ground member such as a semiconductor wafer (hereinafter, referred to as wafer), an adhesive composition forming an adhesive layer provided on an adhesive sheet as described in PTL 1 is known.

CITATION LIST

Patent Literature

[PTL 1] Japanese Unexamined Patent Application, Publication No. H11-343469 (published on Dec. 14, 1999)

SUMMARY OF INVENTION

Technical Problem

Products such as a mobile telephone, digital AV equipment, and an IC card have been improved to have more sophisticated functions. This gives rise to an increase in a demand that semiconductor silicon chips (hereinafter, referred to as chips) provided in the products are downsized and thinned so that silicon can be provided with higher density in a package. For example, for an integrated circuit in which a plurality of chips are provided in one package, such as a CSP (chip size package) or an MCP (multi-chip package), there is a demand that the chips be thinned. In order to realize the chips to have a higher density in the package, it is necessary for chips to be thinned to have a thickness in a range of 25 μm to 150 μm.

By a grinding process, wafers (hereinafter, referred to as wafers) which serve as bases for the respective chips are thinned. Thus, the strength of the wafers becomes weakened. With the strengths of the wafers being weakened, it is easy for cracks or warpages to be formed in the wafer. In addition, the wafers weakened in strength by the thinning are not easily automatically carried and thus, need to be carried manually. As can be understood from this, handling of the wafers is troublesome.

As a countermeasure, a wafer handling system is developed which adds strengths to the wafers. According to the wafer handling system, a plate called a support plate, which is made from glass, rigid plastic, or the like is bonded to the wafers to be thinned so that the strength of the wafer is held, and the wafers are prevented from being cracked or warped. Since the strength of the wafers can be secured by the wafer handling system, it is possible to automatically carry the semiconductor wafers after the thinning process.

In the wafer handling system, the wafers and the support plate are bonded to each other by using an adhesive layer formed by an adhesive tape, a thermoplastic resin, an adhesive, or the like. Then, in a state of being bonded to the support plate by the adhesive layer, a wafer is subjected to processes such as a thinning treatment, a treatment at high temperature. Therefore, the adhesive layer is required to have both easiness of bonding by which a support plate and a wafer can easily be bonded and heat resistance by which a suitable bonding of a wafer and a support plate is achieved through a process.

However, in an adhesive layer formed by using an adhesive composition in the related art such as an adhesive material disclosed in PTL 1, easiness of bonding and heat resistance are not sufficient, wafer breakage occurs during bonding or during a process, and stripping of a wafer from a support plate also occurs during a process.

Therefore, development of an adhesive composition capable of forming an adhesive layer having excellent easiness of bonding and heat resistance is required.

The present invention has been made in consideration of the above problems, an object of the present invention is to provide an adhesive composition capable of forming an adhesive layer having excellent easiness of bonding and heat resistance, an adhesive film obtained by forming an adhesive layer made of the adhesive composition, and a bonding method using the adhesive composition.

Solution to Problem

To solve the above problems, the adhesive composition according to the present invention is an adhesive composition containing a block copolymer, and an adhesive layer formed by using the adhesive composition has a Young's modulus of 0.1 GPa or greater at 23° C., a storage modulus (G') of $1.5 \times 10^5$ Pa or less at 220° C., and a loss factor (tan σ) of 1.3 or less at 220° C.

In addition, the adhesive film of the present invention is obtained by forming an adhesive layer made of the adhesive composition on a film.

Furthermore, the bonding method according to the present invention includes a bonding step of bonding a support to a wafer by using the adhesive composition according to the present invention.

Advantageous Effects of Invention

The adhesive composition according to the present invention contains a block copolymer, and an adhesive layer formed by using the adhesive composition has a Young's modulus of 0.1 GPa or greater at 23° C., a storage modulus (G') of $1.5 \times 10^5$ Pa or less at 220° C., and a loss factor (tan σ) of 1.3 or less at 220° C., and therefore, it is possible to provide an adhesive composition capable of forming an adhesive layer having excellent easiness of bonding and heat resistance.

DESCRIPTION OF EMBODIMENTS

Hereinafter, embodiments of the present invention will be described in detail.

[Adhesive Composition]

The adhesive composition according to the present invention is a adhesive composition containing a block copolymer, and an adhesive layer formed by using the adhesive composition has a Young's modulus of 0.1 GPa or greater at 23° C., a storage modulus (G') of $1.5 \times 10^5$ Pa or less at 220° C., and a loss factor (tan σ) of 1.3 or less at 220° C.

(Block Copolymer)

The block copolymer included in the adhesive composition according to the present invention is a polymer in which two or more kinds of block portions in which monomer units are continuously bonded are bound, and is also referred to as a block copolymer.

As the block copolymer, various block copolymers can be used, and for example, a styrene-isoprene-styrene block copolymer (SIS), a styrene-butadiene-styrene block copolymer (SBS), a styrene-butadiene-butylene-styrene block copolymer (SBBS), a styrene-ethylene-butylene-styrene block copolymer (SEBS), a styrene-ethylene-propylene-styrene block copolymer (styrene-isoprene-styrene block copolymer) (SEPS), a styrene-ethylene-ethylene-propylene-styrene block copolymer (SEEPS), a styrene-ethylene-ethylene-propylene-styrene block copolymer (Septon V9461 (manufactured by Kuraray Co., Ltd.) or Septon V9475 (manufactured by Kuraray Co., Ltd.)) of which the styrene block is a reaction crosslinking type, or a styrene-ethylene-butylene-styrene block copolymer (having a reactive polystyrene-based hard block, Septon V9827 (manufactured by Kuraray Co., Ltd.)) of which the styrene block is a reaction crosslinking type can be used.

At least one functional group-containing atomic group may be bonded to the block copolymer according to the present invention. For example, the block copolymer can be obtained by bonding at least one functional group-containing atomic group to a known block copolymer by using a modifying agent.

The functional group-containing atomic group is an atomic group including one or more functional groups. Examples of the functional groups included in the functional group-containing atomic group of the present invention include an amino group, an acid anhydride group (preferably, a maleic anhydride group), an imido group, a urethane group, an epoxy group, an imino group, a hydroxyl group, a carboxyl group, a silanol group, and an alkoxysilane group (the alkoxy group has preferably 1 to 6 carbon atoms). In the present invention, the block copolymer is an elastomer, and has a functional group that results in polarity. In the present invention, by containing a block copolymer having at least one functional group-containing atomic group, flexibility and adhesiveness of the adhesive composition are improved.

As the block copolymer, a diblock copolymer or a triblock copolymer is preferable, and a triblock copolymer is more preferable. In addition, a diblock copolymer and a triblock copolymer may be used in combination. Thus, it is possible to make the loss factor (tan σ) at 220° C. of an adhesive layer formed by using the adhesive composition described below be an optimal value of 1.3 or less.

In addition, the block copolymer preferably contains a styrene group, and both terminals of the main chain are preferably styrene groups. This is because higher heat resistance is exhibited by blocking styrene having high heat stability at both terminals thereof. Moreover, the "styrene group" may have a substituent. Examples of the substituent include an alkyl group having 1 to 5 carbon atoms, an alkoxy group having 1 to 5 carbon atoms, an alkoxyalkyl group having 1 to 5 carbon atoms, an acetoxy group, and a carboxyl group.

The styrene group content of the block copolymer is preferably 10% by weight to 65% by weight, and more preferably 13% by weight to 45% by weight. Thus, it is possible to make the Young's modulus at 23° C. of an adhesive layer formed by using the adhesive composition described below be an optimal value of 0.1 GPa or greater.

Furthermore, the weight average molecular weight of the block copolymer is preferably 50,000 to 150,000, and more preferably 60,000 to 120,000. Thus, it is possible to make the storage modulus (G') at 220° C. of an adhesive layer formed by using the adhesive composition described below be an optimal value of $1.5 \times 10^5$ Pa or less.

In addition, in a case where the styrene group content of the block copolymer is in a range of 13% by weight to 50% by weight and the weight average molecular weight of the block copolymer is in a range of 50,000 to 150,000, solubility in hydrocarbon-based solvents is excellent, and thus it is more preferable. Thus, when removing an adhesive layer formed by the adhesive composition, it is possible to easily and quickly remove using a hydrocarbon-based solvent.

Furthermore, the block copolymer is more preferably a hydrogenated product. In a case where the block copolymer is a hydrogenated product, stability with respect to heat is further improved, and changes in quality such as decomposition and polymerization are less likely to occur. In addition, the hydrogenated product is more preferable from the viewpoint of solubility in hydrocarbon-based solvents and resistance to resist solvents.

In addition, the block copolymer preferably includes a unit of which a glass transition temperature is 23° C. or lower. In a case where the block copolymer includes a unit of which the glass transition temperature is 23° C. or lower, it is possible to make the Young's modulus at 23° C. of an adhesive layer formed by using the adhesive composition described below be an optimal value of 0.1 GPa or greater.

Plural kinds of the block copolymer may be used in combination. In other words, the adhesive composition according to the present invention may include plural kinds of the block copolymer. At least one of plural kinds of the block copolymer preferably includes a styrene group. Furthermore, a case where the styrene group content in at least one of plural kinds of the block copolymer is in a range of 10% by weight to 65% by weight, or a case where the weight average molecular weight of at least one of plural kinds of the block copolymer is in a range of 50,000 to 150,000 is within the scope of the present invention. In addition, in the adhesive composition according to the present invention, in a case of including plural kinds of the block copolymer, as a result of mixing, the content of a styrene group may be adjusted to be in the above range.

The content of the block copolymer with respect to a polymer included in the adhesive composition according to the present invention is preferably 15% by weight or greater, and more preferably 30% by weight or greater. Thus, it is possible to suitably provide an adhesive composition capable of forming an adhesive layer having excellent easiness of bonding and heat resistance.

(Adhesive Layer Formed by Using Adhesive Composition)

An adhesive layer formed by using the adhesive composition according to the present invention has the Young's modulus of 0.1 GPa or greater at 23° C., the storage modulus (G') of $1.5 \times 10^5$ Pa or less at 220° C., and the loss factor (tan σ) of 1.3 or less at 220° C.

The Young's modulus at 23° C. of the adhesive layer is 0.1 GPa or greater, more preferably 0.15 GPa or greater, and still more preferably 0.2 GPa or greater. Here, the Young's modulus of the adhesive layer means an elastic coefficient obtained by measuring an indentation depth by a load using a known elastic coefficient measurement apparatus.

For example, an adhesive layer of which the Young's modulus at 23° C. is 0.1 GPa or greater can be formed by using an adhesive composition containing a block copolymer of which the styrene group content is 10% by weight to 65% by weight. That is, the Young's modulus of the adhesive layer can be determined by the styrene group content of the block copolymer included in the adhesive composition to be formed.

The storage modulus at 220° C. of the adhesive layer is preferably 1.5×10 Pa or less, and more preferably 6×10⁴ Pa or less. Here, the storage modulus means a storage modulus measured by a known dynamic viscoelasticity measurement apparatus when the temperature is raised at a rate of 5° C./min in a temperature range of 50° C. to 250° C., using a sample having a shape of which a thickness is 1 mm and a diameter is ϕ25 mm, under a shear condition of a frequency of 1 Hz.

For example, an adhesive layer of which the storage modulus at 220° C. is 1.5×10⁵ Pa or less can be formed by using an adhesive composition containing a block copolymer of which the weight average molecular weight is 50,00 to 150,000. That is, the storage modulus of the adhesive layer can be adjusted by the weight average molecular weight of the block copolymer included in the adhesive composition to be formed.

The loss factor of the adhesive layer is preferably 1.3 or less, more preferably 1 or less, and still more preferably 0.9 or less. Here, the loss factor means a loss factor measured using a known dynamic viscoelasticity measurement apparatus when the temperature is raised at a rate of 5° C./min in a temperature range of 50° C. to 250° C. under shear conditions of a sample shape of which a thickness is 1 mm and a diameter is ϕ25 mm and a frequency of 1 Hz.

For example, an adhesive layer of which the loss factor at 220° C. is 1.3 or less can be formed by using an adhesive composition containing a diblock copolymer, a triblock copolymer, or a combined compound of these. That is, the loss factor of the adhesive layer can be determined by the block copolymer included in the adhesive composition to be formed.

The adhesive layer formed by using the adhesive composition according to the present invention has the Young's modulus of 0.1 GPa or greater at 23° C., the storage modulus (G') of 1.5×10⁵ Pa or less at 220° C., and the loss factor (tan σ) of 1.3 or less at 220° C., and thus, easiness of bonding and heat resistance are excellent.

(Solvent)

The solvent included in the adhesive composition according to the present invention is not limited as long as it can dissolve the block copolymer. For example, a nonpolar hydrocarbon-based solvent, a polar petroleum-based solvent, or a nonpolar petroleum-based solvent can be used.

Preferably, the solvent may include condensed polycyclic hydrocarbon. The condensed polycyclic hydrocarbon included in the solvent can prevent clouding of the solvent when an adhesive composition is stored in a liquid form (particularly, at a low temperature). This can improve product stability.

The hydrocarbon-based solvent can be linear, branched, or cyclic hydrocarbon. Examples of the hydrocarbon-based solvent include linear hydrocarbons such as hexane, heptane, octane, nonane, methyloctane, decane, undecane, dodecane and tridecane, branched hydrocarbons having 3 to 15 carbon atoms; saturated aliphatic hydrocarbons such as p-mentane, o-mentane, m-mentane, diphenyl mentane, 1,4-terpine, 1,8-terpine, bornane, norbornane, pinane, thujane, carane, and longifolene, α-terpinene, β-terpinene, γ-terpinene, α-pinene, β-pinene, α-thujone, β-thujone, and the like.

Examples of the petroleum-based solvent include cyclohexane, cycloheptane, cyclooctane, naphthalene, decahydronaphthalene, tetrahydronaphthalene, and the like.

In addition, the condensed polycyclic hydrocarbon is a hydrocarbon consisting of condensed rings in which two or more monocycles are bonded with each other by sharing only one side thereof, and a hydrocarbon formed by condensation of two monocycles is preferably used.

Examples of the hydrocarbon include a hydrocarbon in which a five-membered ring and a six-membered ring are combined with each other and a hydrocarbon in which two six-membered rings are combined with each other. Examples of the hydrocarbon in which a five-membered ring and a six-membered ring are combined with each other include indene, pentalene, indane, and tetrahydroindene, and examples of the hydrocarbon in which two six-membered rings are combined with each other include naphthalene, tetrahydronaphthalene (tetralin), and decahydronaphthalene (decalin).

In addition, in a case where the solvent contains the condensed polycyclic hydrocarbon, the component included in the solvent may be only the condensed polycyclic hydrocarbon, or may include other components such as a saturated aliphatic hydrocarbon. In either case, the content of the condensed polycyclic hydrocarbon is preferably 40 parts by weight or more and more preferably 60 parts by weight or more with respect to the weight of the entire hydrocarbon solvent. In a case where the content of the condensed polycyclic hydrocarbon is 40 parts by weight or more with respect to the weight of the entire hydrocarbon solvent, it is possible to obtain a high solubility for the resin. In a case where a mixing ratio of the condensed polycyclic hydrocarbon and the saturated aliphatic hydrocarbon is controlled within either of the above content ranges, it is possible to moderate the odor of the condensed polycyclic hydrocarbon.

Moreover, the content of a solvent in the adhesive composition of the present invention is suitably adjusted according to a thickness of the adhesive layer which is formed by using the adhesive composition, and for example, when the total amount of the adhesive composition is 100 parts by weight, it is preferable that the content of a solvent be in a range of 20 parts by weight to 90 parts by weight. In a case where the content of a solvent is in the above range, it is possible to easily perform viscosity adjustment.

(Thermal Polymerization Inhibitor)

In the present invention, the adhesive composition may contain a thermal polymerization inhibitor. The thermal polymerization inhibitor has a function to prevent a radical polymerization reaction by heating. Specifically, since the thermal polymerization inhibitor has a high reactivity with respect to a radical, the thermal polymerization inhibitor reacts preferentially with radicals than with monomers, thereby inhibiting polymerization of the monomers. Therefore, in the adhesive composition including such a thermal polymerization inhibitor, a polymerization reaction is suppressed under a high temperature condition (particularly, at a temperature range 250° C. to 350° C.)

In a manufacturing process of a semiconductor, for example, there is a high-temperature process in which a wafer to which a support plate (support) is adhered is heated at a temperature of 250° C. for 1 hour. If a polymerization reaction occurs in the adhesive composition by the high temperature during the high temperature process, solubility of the adhesive composition with respect to a stripping solution which is used to strip the support plate from the wafer after the high temperature process is decreased, and it is not possible to favorably strip the support plate from the wafer. However, in the adhesive composition of the present invention containing the thermal polymerization inhibitor, oxidation by heat and a polymerization reaction caused by the oxidation are suppressed, and thus, even after the high temperature process, it is still possible to easily strip the support plate, and it is possible to suppress generation of residue.

The thermal polymerization inhibitor is not particularly limited as long as it is effective in preventing a radical polymerization reaction by heat, and the thermal polymerization inhibitor is preferably a thermal polymerization inhibitor having phenol. By using the thermal polymerization inhibitor containing phenol, it is possible to secure a favorable solubility even after the high temperature treatment is performed in ordinary atmosphere. As the thermal polymerization inhibitor, a hindered phenol-based antioxidant can be used, and examples thereof include pyrogallol, benzoquinone, hydroquinone, methylene blue, tert-butylcatechol, monobenzyl ether, methylhydroquinone, amylquinone, amyloxyhydroquinone, n-butylphenol, phenol, hydroquinone monopropyl ether, 4,4'-(1-methylethylidene)bis(2-methylphenol), 4,4'-(1-methylethylidene)bis(2,6-dimethylphenol), 4,4'-[1-[4-(1-(4-hydroxyphenyl)-1-methylethyl)phenyl]ethylidene]bisphenol, 4,4',4''-ethylidenetris(2-methylphenol), 4,4',4''-ethylidenetrisphenol, 1,1,3-tris(2,5-dimethyl-4-hydroxyphenyl)-3-phenylpropane, 2,6-di-tert-butyl-4-methylphenol, 2,2'-methylenebis(4-methyl-6-tert-butylphenol), 4,4'-butylidenebis(3-methyl-6-tert-butylphenol), 4,4'-thiobis(3-methyl-6-tert-butylphenol), 3,9-bis[2-(3-(3-tert-butyl-4-hydroxy-5-methylphenyl)-propionyloxy)-1,1-dimethylethyl]-2,4,8,10-tetraoxaspiro(5, 5)undecane, triethyleneglycol-bis-3-(3-tert-butyl-4-hydroxy-5-methylphenyl)propionate, n-octyl-3-(3,5-di-tert-butyl-4-hydroxyphenyl)propionate, penta-erythryl-tetrakis-[3-(3,5-di-tert-butyl-4-hydroxyphenyl)propionate] (product name:IRGANOX1010, manufactured by Chiba JAPAN Co., Ltd.), tris(3,5-di-tert-butylhydroxybenzil)isocyanurate, and thiodiethylenebis[3-(3,5-di-tert-butyl-4-hydroxyphenyl) propionate]. The thermal polymerization inhibitor may be used alone, or two or more kinds may be used in combination.

The content of the thermal polymerization inhibitor is suitably determined according to a type of a block copolymer, use of the adhesive composition, and an environment in which the adhesive composition is used, and for example, if the block copolymer is 100 parts by weight, the content of the thermal polymerization inhibitor is preferably 0.1 part by weight to 10 parts by weight. In a case where the content of the thermal polymerization inhibitor is in the above range, an effect suppressing a polymerization by heat is favorably exhibited, and decrease in solubility of the adhesive composition with respect to a stripping solution can be further suppressed after the high-temperature process.

(Entrainer)

The adhesive composition according the present invention may contain an entrainer which dissolves the thermal polymerization inhibitor and has a composition different from a composition of a solvent for dissolving a block polymer. The entrainer is not particularly limited, and an organic solvent which dissolves components included in the adhesive composition can be used.

For example, the organic solvent may be any one organic solvent or a combination of two or more organic solvents, provided that the organic solvent can dissolve the components of the adhesive composition so as to produce a homogeneous solution.

A specific example of the organic solvent includes a terpene solvent including an oxygen atom, a carbonyl group, or an acetoxy group as a polar group, and examples of the organic solvent include geraniol, nerol, linalool, citral, citronellol, menthol, isomenthol, neomenthol, α-terpineol, β-terpineol, γ-terpineol, terpinene-1-ol, terpinene-4-ol, dihydroterpinylacetate, 1,4-cineol, 1,8-cineol, borneol, carvone, ionone, thujone, or camphor. In addition, examples of the organic solvent include lactone such as γ-butyrolactone or the like; ketones such as acetone, methylethylketone, cyclohexanone (CH), methyl-n-pentylketone, methylisopentylketone, or 2-heptanone; polyols such as ethyleneglycol, diethyleneglycol, propyleneglycol, or dipropyleneglycol; compounds having an ester bonding such as ethyleneglycol monoacetate, diethyleneglycol monoacetate, propyleneglycol monoacetate, or dipropyleneglycol monoacetate, monoalkyl ether of the polyalcohol or the compound having the ester bonding, such as monomethyl ether, monoethyl ether, monopropyl ether, monobutyl ether, a derivative of a polyalcohol such as compounds having an ether bonding, such as monophenyl ether (among these, propyleneglycol monomethyl ether acetate (PGMEA), propyleneglycol monomethyl ether (PGME) are preferable); cyclic ethers such as dioxane, esters such as methyl lactate, ethyl lactate (EL), methyl acetate, ethyl acetate, butyl acetate, methyl pyruvate, ethyl pyruvate, methyl methoxypropionate, or ethyl ethoxypropionate; or an aromatic-based organic solvent such as anisole, ethylbenzil ether, cresylmethyl ether, diphenyl ether, dibenzyl ether, phenetol, or butylphenyl ether.

The content of the entrainer is suitably determined according to a type of the thermal polymerization inhibitor or the like, and for example, when the total of a solvent (main solvent) which dissolves a block polymer and a solvent (entrainer) which dissolves the thermal polymerization inhibitor is 100 parts by weight, the content of the entrainer is preferably 1 part by weight to 50 parts by weight, and more preferably 1 part by weight to 30 parts by weight. In a case where the content of the entrainer is in the above range, it is possible to sufficiently dissolve the thermal polymerization inhibitor.

(Other Components)

The adhesive composition may further include another miscible substance within a range not impairing essential features of the present invention. For example, in the adhesive, various additives commonly used to improve performance of the adhesive such as an additive resin, a plasticizer, an adhesion auxiliary agent, a stabilizer, a colorant, and a surfactant can be further used.

(Method for Preparing Adhesive Composition)

A method for preparing the adhesive composition according to the present invention is not particularly limited and a known method may be used. For example, the adhesive composition according to the present invention can be obtained by dissolving a block copolymer in the main solvent and stirring each composition by using an existing stirrer.

In a case where the thermal polymerization inhibitor is added to the adhesive composition according to the present invention, it is preferable to add the thermal polymerization inhibitor which was dissolved in advance in the entrainer to the adhesive composition of the invention.

[Use of Adhesive Composition]

The adhesive composition according to the present invention is used for adhering a wafer and a support of the wafer.

For example, the support is a member which supports in a process of thinning a wafer, and is adhered to the wafer by an adhesive layer formed by using the adhesive composition according to the present invention. In the embodiment, for example, the support is formed of glass or silicon of which the film thickness is in a range of 500 μm to 1,000 μm.

Moreover, in the embodiment, the support has a though-hole penetrating in a thickness direction of the support. By pouring the solvent which dissolves the adhesive composition in between the support and the wafer through the through-hole, it is possible to easily separate the support and the substrate.

In addition, in another embodiment, a reaction layer in addition to an adhesive layer may be provided between a support and a wafer. The reaction layer is changed in quality by absorbing light irradiated through the support, and by changing the reaction layer in quality by irradiating light or the like thereto, it is possible to easily separate the support and the wafer. In this case, it is preferable to use, as the support, a support having no through-hole penetrating in a thickness direction of the support.

As the light irradiated to the reaction layer, laser lights such as solid-state lasers including a YAG laser, a ruby laser, a glass laser, a YVO; laser, an LD laser, a fiber laser, and the like, liquid lasers including a dye laser and the like, gas lasers including a $CO_2$ laser, an excimer laser, an Ar laser, a He—Ne laser, and the like, a semiconductor laser and a free electron laser, or non-laser lights may be suitably used according to the wavelength which can be absorbed by the reaction layer. For example, the wavelength of light to be absorbed by the reaction layer is a wavelength of 600 nm or less, and it is not limited thereto.

The reaction layer may contain, for example, a light absorbent which is decomposed by light or the like. Examples of the light absorbent include pigments and dyes such as fine particle metal powders such as graphite powder, iron, aluminum, copper, nickel, cobalt, manganese, chrome, zinc and tellurium, metal oxide powders such as black titanium oxide, carbon black, an aromatic diamine-based metal complex, an aliphatic diamine-based metal complex, an aromatic dithiol-based metal complex, a mercaptophenol-based metal complex, a squarylium-based compound, a cyanine-based pigment, a methine-based pigment, a naph-thoquinone-based pigment, and an anthraquinone-based pigment. The reaction layer can be formed by, for example, applying a mixture of the light absorbent and a binder resin onto the support. In addition, a resin having a light absorbing group can be used.

In addition, the reaction layer may be an inorganic or organic film formed by a plasma CVD method. For example, as the inorganic film, a metal film can be used. In addition, as the organic film, a fluorocarbon film can be used. The reaction film can be formed on the support by, for example, a plasma CVD method.

In addition, the adhesive composition according to the present invention is suitably used for adhesion of a wafer subjected to a thinning process after being adhered to a support and the support. As described above, the support holds the strength of a wafer when the wafer is thinned. The adhesive composition according to the present invention is suitably used for adhering such a wafer and support.

Furthermore, since the adhesive composition according to the present invention has a low dynamic viscosity even at high temperature and does not flow even when supplied for a long period of time to a high temperature process, by an adhesive layer formed by using this, a wafer and a support can be easily bonded, and in a wafer thinning process, flexibility of the adhesive layer does not become high even at an edge portion of the wafer, and wafer stripping does not occur.

In addition, the adhesive composition according to the present invention is suitably used for adhesion of a wafer exposed in an environment of 220° C. or higher after being adhered to a support and the support. Since the adhesive composition according to the present invention has excellent heat resistance, the adhesive composition is suitably used for adhesion of a wafer exposed in an environment of 220° C. or higher after being adhered to a support and the support.

Moreover, a method for manufacturing a laminate adhering a wafer and a support with the adhesive composition according to the invention, a method for thinning a wafer of the laminate, and a method for heating the laminate at a temperature of 220° C. or higher are also within the scope of the present invention.

[Adhesive Film]

The adhesive composition according to the present invention can be adopted in various ways according to the use. For example, the adhesive composition can be used in a method in which the adhesive layer is formed by applying the adhesive composition in a liquid form on a work object such as a semiconductor wafer, or a method (adhesive film method) in which the adhesive film of the present invention is bonded to a work object of a semiconductor wafer and the like. According to the adhesive film method, the adhesive film of the present invention is prepared in advance by forming the adhesive layer on a film, such as a flexible film, by use of the adhesive composition and drying the adhesive film thus formed.

The adhesive film according to the present invention thus includes the adhesive layer which contains an adhesive composition, on the film.

The adhesive layer of the adhesive film may be covered with a protecting film. In this case, the adhesive layer is uncovered by stripping the protecting film, the adhesive layer thus uncovered is stacked on the work object, and the film is stripped from the adhesive layer. In this way, it is possible to easily form the adhesive layer on the work object.

Therefore, by using the adhesive film, it is possible to provide the adhesive layer whose film thickness uniformity and surface smoothness are excellent as compared with an adhesive layer formed by applying the adhesive composition directly on the work object.

The film thus used in preparation of the adhesive film is not particularly limited, as long as the film is a release film which can be stripped from the adhesive layer formed on a film so as to allow transferring of the adhesive layer from the adhesive film onto a work surface of the work object such as a protecting substrate or a wafer. For example, the film can be a flexible film which is made of a synthetic-resin film containing polyethylene terephthalate, polyethylene, polypropylene, polycarbonate, or polyvinyl chloride whose film thickness is in a range of 15 μm to 125 μm. It is preferable that the film be subjected to a release process if necessary, so as to make transferring of the adhesive layer easy.

The method in which the adhesive layer is formed on the film may be a method in which the adhesive layer is formed by applying the adhesive composition of the present invention on the film at a thickness that will be in a range from 10 μm to 1,000 μm after drying, in which the adhesive composition of the present invention may be applied appropriately in consideration of a desired film thickness and uniformity of the adhesive layer and application may be performed by using a known method.

In a case where the protecting film is used, the protecting film is not limited as long as it can be stripped from the adhesive layer. For example, it is preferable that the protecting film be a polyethylene terephthalate film, a polypropylene film, or a polyethylene film. Further, it is preferable that the protecting film be subjected to a silicone coating process or a silicon baking process. This is because the protecting film subjected to the silicon coating process or the silicon baking process can be easily stripped from the adhesive layer. A thickness of the protecting film is preferably, but not particularly limited to, in a range from 15 μm to 125 μm. This is because it is possible to secure flexibility of the adhesive film with the protecting film.

The method in which the adhesive film is used is not limited to a particular method. For example, in a case where the protecting film is used, a thermal compression method can be used. According to the thermal compression method, the adhesive layer is uncovered by stripping the protecting film, stacked on the work object, and thermally compressed on the surface of the work object by moving a heating roller on the film (a surface opposite to a surface on which the adhesive layer is formed). After stripping, it is optional to sequentially reel the protecting film stripped from the adhesive film in a roll form by using a roller such as a reel roller. In this case, the protecting film can be stored and reused.

Since the adhesive film according to the present invention has a low dynamic viscosity even at high temperature and does not flow even when supplied for a long period of time to a high temperature process, a wafer and a support can be easily bonded, and in a wafer thinning process, flexibility of the adhesive layer does not become high even at an edge portion of the wafer, and wafer stripping does not occur.

[Bonding Method]

The bonding method according to the present invention includes a bonding step of bonding a support to a wafer by using the adhesive composition according to the present invention. Since by bonding a wafer and a support using the adhesive composition according to the present invention, the adhesive composition does not flow even when supplied for a long period of time to a high temperature process, by using this, a wafer and a support can be easily bonded, and bonding failure does not occur.

In the bonding step, a support may be bonded to a wafer through an adhesive layer formed in advance using the adhesive composition according to the present invention. For example, the adhesive layer can be formed by applying the adhesive composition on a wafer and baking. The baking temperature and the baking time of the adhesive composition can be suitably selected according to the adhesive composition or the like used.

In addition, in the bonding step, a support can be bonded to a wafer by heating and pressurizing in a reduced pressure environment. The temperature, the time, and the pressure when a support is bonded to a wafer can be suitably selected according to the adhesive composition or the like used, and for example, the bonding temperature is in a range of 50° C. to 250° C., and preferably in a range of 100° C. to 250° C. The bonding time is in a range of 10 seconds to 15 minutes, and preferably in a range of 30 seconds to 10 minutes. The bonding pressure is in a range of 100 kg to 10,000 kg, and preferably in a range of 1,000 kg to 10,000 kg. In addition, in the bonding step, a wafer and a support may be bonded in a decompressed state (for example, 1 Pa or less).

EXAMPLES

Example (Preparation of Adhesive Composition)

100 parts by weight of H1051 (manufactured by Asahi Kasei Chemicals Corporation, SEBS: triblock copolymer of styrene-ethylene/butylene-styrene, styrene content of 42% by weight, and molecular weight of 78,800) which is a triblock copolymer was dissolved in 280 parts by weight of decahydronaphthalene shown in the following chemical formula (I) which is a main solvent.

[Chemical formula 1]

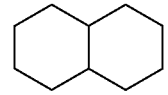

(I)

Next, a solution in which "IRGANOX (product name) 1010" manufactured by BASF Corporation which is a thermal polymerization inhibitor was dissolved in butyl acetate was added to 100 parts by weight of the triblock copolymer such that the thermal polymerization inhibitor becomes 1 part by weight, and the butyl acetate becomes 20 parts by weight. Thus, the adhesive composition of Example 1 was prepared.

(Evaluation of Physical Properties of Adhesive Layer)

First, the adhesive composition of Example 1 prepared was spin-coated on a silicon wafer (12 inches), and the resultant product was baked at 100° C., 160° C., and 200° C. for 3 minutes respectively, in a hot plate under atmospheric pressure, thereby forming an adhesive layer (thickness: 50 μm). The Young's modulus of the adhesive layer formed on the wafer was measured under the conditions of a maximum test load of 5 mN, a load application time of 20 seconds, and a creep time of 5 seconds using a FISCHER SCOPE Hm2000 measurement apparatus (manufactured by Thermo Fisher Scientific Inc.). The Young's modulus at 23° C. of the adhesive layer was 0.34 GPa as shown in Table 1.

In addition, the adhesive composition of Example 1 prepared was applied to a polyethylene film treated with a release agent, and the resultant product was baked at 100° C. and 180° C. for 60 minutes respectively, in an oven under atmospheric pressure, thereby forming an adhesive layer (thickness: 0.5 mm). The storage modulus (G', unit: Pa) and the loss factor (tan σ) of the adhesive layer stripped from the polyethylene film were measured using a dynamic viscoelasticity measurement apparatus (VAR100, manufactured by Thermo Fisher Scientific Inc.). The storage modulus (G') and the loss factor (tan σ) at 220° C. were measured under the conditions that the temperature is raised at a rate of 5° C./min from room temperature to 220° C. using a sample having a shape of which a thickness is 1 mm and a diameter is ϕ25 mm, and a parallel plate of ϕ25 mm, under a shear condition of a frequency of 1 Hz. As shown in Table 1, the storage modulus at 220° C. was $4.9 \times 10^4$ Pa, and the loss factor at 220° C. was 0.54.

(Process Evaluation of Adhesive Layer)

The adhesive composition of Example 1 prepared was spin-coated on a silicon wafer (12 inches), and the resultant product was baked at 100° C., 160° C., and 200° C. for 4 minutes respectively, in a hot plate under atmospheric pressure, thereby forming an adhesive layer (thickness: 50 μm). The obtained adhesive layer was bonded to a glass support (12 inches) for 3 minutes under the conditions of 220° C. and 4,000 kg in a reduced pressure environment of 1 Pa or less, thereby a laminate was produced. As shown in Table 1, in this step, bonding failure to the laminate did not occur (O).

<Thinning Process>

In the produced laminate, the wafer was thinned by being ground up to 40 μm, and appearance of the wafer after thinning was observed with a microscope. As a result of the observation, as shown in Table 1, stripping of the wafer and bonding failure in the laminate did not occur (O).

<CVD Process and Curing Process>

The produced laminate was subjected to a plasma CVD process at 220° C. for 5 minutes, and a curing process of heating at 220° C. for 3 hours in a nitrogen environment. Moreover, the CVD process corresponds to a forming step of a thermal oxide film or a nitride film, and the curing process corresponds to a forming step of an insulating film such as polyimide.

Appearance of the wafer after the CVD process and the curing process was observed with a microscope, and bonding failure (unadhered portion) which causes a wafer breakage or decrease in a critical dimension uniformity of the wafer and fluidity of the edge portion of the adhesive layer were evaluated. The fluidity of the edge portion was evaluated by observing whether the edge portion of the adhesive layer was raised on the wafer or the shape of the adhesive layer of the edge portion was changed. As a result of the observation, as shown in Table 1, in the laminate, fluidity of the edge portion did not occur, and stripping of the wafer and bonding failure did not occur (O).

In addition, the adhesive compositions of Examples 2 to 16 were prepared in the same manner as in Example 1 using each of the block copolymers described in Table 1, adhesive layers were formed in the same manner as in Example 1, and an evaluation of physical properties and a process evaluation were performed. The results are shown in Table 1. "E" shown in Table 1 refers to an exponent ($4.9E+04=4.9\times10^4$). In addition, "part(s)" shown in Table 1 refers to "part(s) by weight".

<Block Copolymer>

In Examples 2 to 16, as the block copolymer,

H1051 (manufactured by Asahi Kasei Chemicals Corporation, SEBS, triblock copolymer of styrene-ethylene/butylene-styrene, styrene content of 42% by weight, and molecular weight of 78,800);

G1726 (manufactured by Kraton performance Polymers Inc., SEBS/SEB: combination of triblock copolymer of styrene-ethylene/butylene-styrene block and diblock copolymer of styrene-ethylene/butylene, styrene content of 30% by weight, diblock content of 70% by weight (with respect to the total G1726), and molecular weight of 51,300);

G1652 (manufactured by Kraton Performance Polymers Inc, SEBS: triblock copolymer of styrene-ethylene/butylene-styrene, styrene content of 30% by weight, and molecular weight of 77,700);

HG1043 (manufactured by Asahi Kasei Chemicals Corporation, SEBS: triblock copolymer hydrogenated styrene-based thermoplastic elastomer of styrene-ethylene/butylene-styrene block, styrene content of 67% by weight, and molecular weight of 77,000);

HG252 (manufactured by Kuraray Co., Ltd., SEEPS-OH: polystyrene-poly(ethylene-ethylene/propylene)block-polystyrene terminal hydroxyl group modification, styrene content of 28% by weight, and molecular weight of 67,000);

S4033 (manufactured by Kuraray Co., Ltd., SEPS: polystyrene-poly(ethylene/propylene)block-polystyrene, styrene content of 30% by weight, and molecular weight of 95,000);

MP-10 (manufactured by Asahi Kasei Chemicals Corporation, SEBS: triblock copolymer hydrogenated styrene-based thermoplastic elastomer terminal amino modification of styrene-ethylene/butylene-styrene block, styrene content of 30% by weight, and molecular weight of 83,000);

S8004 (manufactured by Kuraray Co., Ltd., SEBS: triblock copolymer of polystyrene-poly(ethylene/butylene) block-polystyrene, styrene content of 31% by weight, and molecular weight of 98,100);

V9827 (manufactured by Kuraray Co., Ltd., SEBS: styrene block is a reaction crosslinking type styrene-ethylene-butylene-styrene block copolymer, styrene content of 30% by weight, and molecular weight of 90,000); and S2002 (manufactured by Kuraray Co., Ltd., SEPS: triblock copolymer of styrene-isoprene-styrene, styrene content of 30% by weight, and molecular weight of 53,000),

TABLE 1

| Example | Block copolymer (G1726 or diblock) | Random copolymer resin | Young's modulus (GPa) | G' (Pa) | Tan σ | Bonding evaluation 220° C. | Thinning evaluation 40 μm Si | CVD evaluation 220° C., 5 minutes | Curing evaluation 220° C., 3 hours |
|---|---|---|---|---|---|---|---|---|---|
| 1 | H1051 | | 0.34 | 4.9E+04 | 0.54 | O | O | O | O |
| 2 | H1051/G1726 = 5/5 | | 0.2 | 1.1E+04 | 1.06 | O | O | O | O |
| 3 | H1051/G1652 = 8/2 | | 0.25 | 5.9E+04 | 0.69 | O | O | O | O |
| 4 | H1043/HG252 = 95/5 | | 1.6 | 5.4E+04 | 0.3 | O | O | O | O |
| 5 | H1043/S4033 = 6/4 | | 1.44 | 9.9E+04 | 0.47 | O | O | O | O |
| 6 | H1043 85 parts | TOPAS8007 15 parts | 1.55 | 5.2E+04 | 0.41 | O | O | O | O |
| 7 | H1043/G1726 = 35/65 | | 0.85 | 8.0E+03 | 0.84 | O | O | O | O |
| 8 | MP-10/HG252 = 6/4 | | 0.12 | 3.6E+04 | 0.93 | O | O | O | O |
| 9 | MP-10/HG252 = 95/5 | | 0.21 | 6.6E+04 | 0.91 | O | O | O | O |
| 10 | S8004 50 parts | TOPAS-TM 30 parts/ A1 20 parts | 0.21 | 1.1E+04 | 1.09 | O | O | O | O |
| 11 | S4033 85 parts | A1 15 parts | 0.19 | 1.3E+05 | 0.59 | O | O | O | O |
| 12 | S4033 50 parts/ HG252 40 parts | A1 10 parts | 0.13 | 1.7E+04 | 1.05 | O | O | O | O |
| 13 | V9827 70 parts | TOPAS-TM 20 parts/ A2 10 parts | 0.11 | 1.7E+04 | 1.16 | O | O | O | O |
| 14 | H1051 80 parts | TOPAS-TM 20 parts | 0.33 | 1.4E+05 | 0.7 | O | O | O | O |
| 15 | V9827 50 parts/ S2002 20 parts | TOPAS-TM 15 parts/ A2 15 parts | 0.1 | 6.9E+03 | 1.28 | O | O | O | O |
| 16 | S8004 35 parts | A1 50 parts/ TOPAS8007 15 parts | 0.28 | 8.2E+03 | 1.19 | O | O | O | O | were mixed in weight ratios shown in Table 1, thereby preparing adhesive compositions.

<Random Copolymer>

Copolymers selected from TOPAS-TM (manufactured by Polyplastics Co., Ltd., cycloolefin copolymer, norbornene: ethylene=65:35 (weight ratio), molecular weight of 10,100, dispersivity of 2.08);

A1: copolymer of (styrene/dicyclopentanyl methacrylate/stearyl methacrylate=20/60/20 (weight ratio), molecular weight of 10,000); and A2: copolymer (styrene/1-adamantyl methacrylate/stearyl methacrylate=20/60/20 (weight ratio), molecular weight of 10,000), were mixed in weight ratios shown in Table 1, thereby preparing adhesive compositions.

As shown in Table 1, in all the adhesive layers formed using the adhesive compositions of Examples 2 to 16, the Young's moduli at 23° C. were 0.1 GPa or greater, the storage moduli (G') at 220° C. were $1.5 \times 10^5$ Pa or less, and the loss factors (tan σ) at 220° C. were 1.3 or less.

In addition, as shown in Table 1, in all the laminates bonded by the adhesive layers formed using the adhesive compositions of Examples 2 to 16, bonding failure did not occur when producing the laminates, and even when the wafer was thinned by being ground up to 40 μm, stripping of the wafer and bonding failure did not occur (O). Furthermore, in all of Examples 2 to 16, after the laminates were subjected to the CVD process and the curing process, fluidity of the edge portion did not occur, and stripping of the wafer and bonding failure did not occur (O).

Comparative Example (Preparation of Adhesive Composition)

100 parts by weight of TOPAS-8007 (manufactured by Polyplastics Co., Ltd., molecular weight of 95,000, dispersivity of 1.9, copolymer of ethylene:norbornene=35:65 (weight ratio)) which is a hydrocarbon resin was dissolved in 280 parts by weight of decahydronaphthalene which is a main solvent. Next, a solution in which "IRGANOX (product name) 1010" manufactured by BASF Corporation which is a thermal polymerization inhibitor was dissolved in butyl acetate was added to 100 parts by weight of the triblock copolymer such that the thermal polymerization inhibitor becomes 1 part by weight, and the butyl acetate becomes 20 parts by weight. In this manner, the adhesive composition of Comparative Example 1 was prepared.

(Evaluation of Physical Properties of Adhesive Layer)

An adhesive layer (thickness: 50 μm) was formed on a silicon wafer (12 inches) in the same manner as in Example, and the Young's modulus of the adhesive layer was measured using a FISCHER SCOPE Hm2000 measurement apparatus (manufactured by Thermo Fisher Scientific Inc.) in the same manner as in Example. As shown in Table 2, the Young's modulus of the adhesive layer was 3.4 GPa.

In addition, an adhesive layer (thickness: 0.5 mm) was formed on a polyethylene film in the same manner as in Example, and the storage modulus (G') and the loss factor (tan σ) of the adhesive layer were measured using a dynamic viscoelasticity measurement apparatus (VAR100, manufactured by Thermo Fisher Scientific Inc.) in the same manner as in Example. As shown in Table 2, the storage modulus (G') at 220° C. thereof was $1.4 \times 10^3$ Pa, and the loss factor (tan σ) at 220° C. thereof was 5.31.

(Process Evaluation of Adhesive Layer)

The prepared adhesive composition was spin-coated on a silicon wafer (12 inches), and the resultant product was baked at 100° C., 160° C., and 200° C. for 4 minutes respectively, in a hot plate under atmospheric pressure, thereby forming an adhesive layer (thickness: 50 μm). Next, under the conditions of a flow rate of 400 sccm, a pressure of 700 mTorr, a high-frequency power of 2500 W, and a film-forming temperature of 240° C., by a CVD method using $C_4F_8$ as a reaction gas, a fluorocarbon film (thickness: 1 μm) was formed on a glass support (12 inches, thickness: 700 pun) as a release layer. Then, the glass support on which a release layer was formed and a wafer substrate were bonded for 3 minutes through an adhesive layer under the conditions of 220° C. and 4,000 kg in a reduced pressure environment of 1 Pa or less, thereby producing a laminate in which the wafer substrate, the adhesive layer, the release layer, and the glass support were laminated in this order. As shown in Table 2, at this step, bonding failure to the laminate did not occur (O).

<Thinning Process>

In the produced laminate, when the wafer was thinned by being ground up to 40 μm in the same manner as in Example, as a result of the observation with a microscope, as shown in Table 2, stripping of the wafer and bonding failure in the laminate did not occur (O).

<CVD Process and Curing Process>

After the produced laminate was subjected to a plasma CVD process at 220° C., and a curing process of heating at 220° C. in a nitrogen environment in the same manner as in Example, appearance of the wafer was observed with a microscope. As a result of the observation, as shown in Table 2, the edge portion flowed, and stripping of the wafer and bonding failure occurred (X).

In addition, the adhesive compositions of Comparative Examples 2 to 5 were prepared in the same manner as in Comparative Example 1 using each of the resins described in Table 2, then adhesive layers were formed in the same manner as in Comparative Example 1, and an evaluation of physical properties and a process evaluation were performed. The results are shown in Table 2. "E" shown in Table refers to an exponent ($1.4E+03=1.4 \times 10^3$).

TABLE 2

| Comparative Example | Resin | Young's modulus (GPa) | G' (Pa) | Tan σ | Bonding evaluation 220° C. | Thinning evaluation 40 μm Si | CVD evaluation 220° C., 5 minutes | Curing evaluation 220° C., 3 hours |
|---|---|---|---|---|---|---|---|---|
| 1 | TOPAS8007 | 3.4 | 1.4E+03 | 5.31 | O | O | X | X |
| 2 | A3 | 4.2 | 1.1E+03 | 9.74 | O | O | X | X |
| 3 | G1726 | 0.031 | 1.3E+03 | 1.85 | O | X | X | X |
| 4 | G1652 | 0.062 | 1.8E+05 | 0.69 | X | X | O | O |
| 5 | Polystyrene | 3.3 | 1.6E+02 | 14.4 | O | O | X | X |

In Comparative Examples 2 to 5, as the resin, using each of A3 (copolymer of styrene/isobornyl methacrylate/methyl methacrylate/acrylic acid=70.5/11.3/17.0/1.1 (weight ratio) shown in Table 2, molecular weight of 75,000), G1726 (manufactured by Kraton performance Polymers Inc.), G1652 (manufactured by Kraton performance Polymers Inc.), or polystyrene (molecular weight of 96,400), adhesive compositions were prepared.

As shown in Table 2, in the adhesive layers formed using the adhesive compositions including the resins of Comparative Examples 2 to 5, there was no adhesive layer which satisfied all of the Young's modulus of at 23° C. of 0.1 GPa or greater, the storage modulus (G') at 220° C. of $1.5 \times 10^5$ Pa or less, and the loss factor (tan σ) at 220° C. of 1.3 or less.

In Comparative Example 4, a bonding failure occurs at the time when the laminate was produced. In addition, in Comparative Examples 4 and 5, after the thinning process, stripping of the wafer and bonding failure occurred. Furthermore, in Comparative Examples 1 to 3 and 5, after the CVD process and the curing process, the edge portion flowed, and stripping of the wafer and bonding failure occurred.

INDUSTRIAL APPLICABILITY

The present invention can be suitably used, for example, in a manufacturing process of a fine semiconductor apparatus.

What is claimed is:

1. A laminate, comprising:
   a wafer;
   an adhesive layer formed by using an adhesive composition; and,
   a support which is formed of glass or silicon,
   the adhesive composition comprising;
      a thermal polymerization inhibitor, and
      a resin consisting of 35-100% by weight of one or more block copolymer(s) and 0-65% by weight of one or more random copolymer(s), wherein:
         the block copolymer(s) each has a weight average molecular weight in a range of 50,000 to 150,000,
         each of the block copolymer(s) is a diblock copolymer, a triblock copolymer, or a combination thereof, and includes a styrene group, both terminals of a main chain of the triblock copolymer are styrene groups,
         a styrene group content of each of the block copolymer(s) is in a range of 10% by weight to 67% by weight, and
         each of the block copolymer(s) is selected from the group consisting of styrene-butadiene-styrene block copolymer (SBS), styrene-butadiene-butylene-styrene block copolymer (SBBS), styrene-ethylene-butylene-styrene block copolymer (SEBS), styrene-ethylene-propylene-styrene block copolymer (SEPS), and styrene-ethylene-ethylene-propylene-styrene block copolymer (SEEPS);
   wherein:
   the adhesive composition does not comprise a plasticizer, and
   the adhesive layer has a Young's modulus of 0.1 GPa or greater at 23° C., a storage modulus (G') of $1.5 \times 10^5$ Pa or less at 220° C., and a loss factor (tan σ) of 1.3 or less at 220° C.

2. The laminate according to claim 1, wherein each of the block copolymer(s) is a hydrogenated product.

3. The laminate according to claim 1, wherein each of the block copolymer(s) includes a unit of which a glass transition temperature is 23° C. or lower.

4. A method for manufacturing the laminate according to claim 1, comprising:
   bonding the support to the wafer by using the adhesive composition.

5. The laminate according to claim 1, wherein each of the random copolymer(s) is at least one selected from the group consisting of a cycloolefin copolymer, a copolymer of styrene/dicyclopentanyl methacrylate/stearyl methacrylate and a copolymer of styrene/1-adamantyl methacrylate/stearyl methacrylate.

6. The laminate according to claim 1, further comprising an entrainer which dissolves the thermal polymerization inhibitor.

7. The laminate according to claim 1, wherein the adhesive composition does not comprise an adhesion auxiliary agent improving adhesive performance of the adhesive composition.

8. The laminate according to claim 1, wherein the styrene group content of each of the block copolymer(s) is in a range of 42% by weight to 67% by weight.

9. The laminate according to claim 1, wherein the styrene group content of each of the block copolymer(s) is in a range of 42% by weight to 65% by weight.

* * * * *